United States Patent [19]
Jordy et al.

[11] Patent Number: 4,635,228
[45] Date of Patent: Jan. 6, 1987

[54] RANDOM ACCESS MEMORY EMPLOYING UNCLAMPED COMPLEMENTARY TRANSISTOR SWITCH (CTS) MEMORY CELLS AND UTILIZING WORD TO DRAIN LINE DIODE SHUNTS

[75] Inventors: George J. Jordy, Wappingers Falls; Joseph M. Mosley, Hopewell Junction, both of N.Y.

[73] Assignee: International Business Machines Corporation, Armonk, N.Y.

[21] Appl. No.: 682,391

[22] Filed: Dec. 17, 1984

[51] Int. Cl.⁴ .............................................. G11C 11/40
[52] U.S. Cl. .................................. 365/154; 365/156; 365/189; 365/190
[58] Field of Search ................ 365/190, 154, 156, 189

[56] References Cited

U.S. PATENT DOCUMENTS

| | | | |
|---|---|---|---|
| 3,979,612 | 9/1976 | Mudge et al. | 307/303 |
| 4,023,148 | 5/1977 | Heuber et al. | 365/156 |
| 4,090,255 | 5/1978 | Berger et al. | 365/154 |
| 4,231,109 | 10/1980 | Ono et al. | 365/174 |
| 4,292,675 | 9/1981 | Denis | 365/156 |
| 4,460,984 | 7/1984 | Knepper | 365/190 |

OTHER PUBLICATIONS

Martin et al., "Low Leakage Complementary Transistor Switch Cell", IBM TBD, vol. 26, No. 7A, Dec. '83, pp. 3229-3230.

Boudon et al., "Fast Data Access in a CTS Cell Matrix Memory", IBM TBD, vol. 23, No. 3, Aug. 1980, pp. 1077-1078.

"AC Write Scheme for Bipolar Random-Access Memories Using Schottky Coupled Cells" by J. A. Dorler, J. M. Mosley, R. O. Seeger and J. R. Struk, IBM Technical Disclosure Bulletin, vol. 23, No. 11, Apr. 1981, pp. 4960-4962.

*Primary Examiner*—Terrell W. Fears
*Attorney, Agent, or Firm*—Wesley DeBruin

[57] ABSTRACT

A random access read/write memory array utilizing unclamped complementary transistor current switch (CTS) memory cells and having m columns and n rows. Each of the m columns of memory cells connected between the bit lines of a discrete one of m pairs of bit lines. Each of the n rows of memory cells connected between the word line and drain line of a discrete one of n pairs of word-drain lines. N identical write enhancement circuit means for enhancing the write operation of the memory array employing unclamped CTS memory cells. The write enhancement circuit means is preferably a single PN diode, or diode connected transistor, connected across each word/drain pair.

2 Claims, 14 Drawing Figures

COMPLEMENTARY TRANSISTOR SWITCH
(CTS) MEMORY CELL

UNCLAMPED CTS
USING A WORD TO DRAIN LINE SHUNT

RANDOM ACCESS MEMORY EMPLOYING UNCLAMPED COMPLEMENTARY TRANSISTOR SWITCH (CTS) MEMORY CELLS AND UTILIZING WORD TO DRAIN LINE DIODE SHUNTS

Field of the Invention

The invention relates to an improved integrated circuit random access read/write memory (RAM) array utilizing unclamped complementary transistor switch (CTS) memory cells and word-drain line circuit means for enhancing the structure and operation of the memory and in particular the "write" operation.

Related Application

U.S. patent application Ser. No. 682,388 "Improved Random Access Memory" filed Dec. 17, 1984 by G. J. Jordy and J. M. Mosley and of common assignee herewith.U.S. application Ser. No. 682,388 filed Dec. 17, 1984 is incorporated herein by reference thereto and to the same extent as though the entire specification and drawings thereof were expressly set-forth herein. Application Ser. No. 682,388 is incorporated herein by reference in order to provide additional description which is not necessary for an understanding of the present invention.

U.S. patent application Ser. No. 625,426 entitled "Improved Gate Array Chip" filed by E. F. Culican et al on June 28, 1984 and of common assignee herewith.

Background of the Invention and Prior Art

With the emergence of VLSI through the advances of integrated circuit technology, denser random access memory (RAM) array chips with high-speed access times are an absolute requirement in computing machine designs. As the industry strives for higher and higher computing speeds, measure in millions of instructions per second (MIPS), the time required to complete each instruction must be decreased. By increasing array densities, the number of array chips required to perform a specific function is reduced and therefore the overall function delay. The invention disclosed and claimed herein is an improved random access memory (RAM) which positively addresses the requirements of speed, size (area), stability and alpha particle sensitivity.

The complementary transistor switch (CTS) memory cell is well known to the art. See for example: (1) U.S. Pat. No. 3,863,229 entitled "SCR (or SCS) Memory Array With Internal and External Load Resistors", granted Jan. 28, 1975 to J. E. Gerbach and of common assignee with the subject application; (2) "AC Write Scheme For Bipolar Random-Access Memories Using Schottky Coupled Cells" by J. A. Dorler et al, IBM TDB Vol. 23, No. 11, April 1981; or, (3) "A 1024-Byte ECL Random Access Memory Using a Complementary Transistor Switch (CTS) Cell" by J. A. Dorler et al, IBM Journal of Research and Development, Vol. 25, No. 3, May 1981 pages 126–134.

The unclamped complementary transistor switch (CTS) memory cell is disclosed in the publication "Saturated CTS Memory Cell Using A PNP Load" by J. A. Dorler et al, IBM TDB, Feb. 1984, Vol. 26, No. 9, pages 4720-1.

Background Art

The following patents and publications are directed to integrated circuit Read/Write memories and/or memory cells for use therein. It is to be appreciated, that the following art is not necessarily the only, the best, or the most pertinent art.

Patents

U.S. Pat. No. 3,979,612 entitled "V-Groove Isolated Integrated Circuit Memory With Integral Pinched Resistors" granted Sept. 7, 1976 to J. L. Mudge et al.

U.S. Pat. No. 4,023,148 entitled "Write Speed-Up Circuit For Integrated Data Memories" granted May 10, 1977 to K. Heuber et al.

U.S. Pat. No. 4,090,255 entitled "Circuit Arrangement For Operating A Semiconductor Memory System" granted May 16, 1978 to H. Berger et al.

U.S. Pat. No. 4,292,675 entitled "Five Device Merged Transistor RAM Cell" granted Sept. 29, 1981 to B. A. Davis.

U.S. Pat. No. 4,460,984 entitled "Memory Array With Switchable Upper and Lower Word Lines" granted July 17, 1984 to R. W. Knepper.

Publication

IBM Technical Disclosure Bulletin publication entitled "AC Write Scheme For Bipolar Random-Access Memories Using Schottky Coupled Cells" by J. A. Dorler et al. Vol. 23, No. 11, April 1981 pages 4960–2.

SUMMARY OF THE INVENTION

A memory array is constructed which is more stable, uses less power, is smaller, has higher performance and operates at a much lower power supply voltage (2.1 v) than other arrays.

A static memory cell is typically a circuit which employs feedback to attain one of two stable states. The simplest circuit which meets this criteria is a pair of cross coupled transistors. Additions to this configuration form various memory cells. Harper cells use additional emitters and resistor loads to form the complete circuit. CTS cells use PNP loads and Schottky diodes for reading/writing.

The progress beyond VLSI allows an increasing number of cells per array. At the same time the cells must consume less power, be stable and have better yield.

What is being described here is not per se a new cell but to re-examine how existing cells are used. Most present array cells are SBD protected against saturation. This was clearly needed when the number of cells was small, the transistors were large and the currents were large to accommodate high speed at high capacitances. This would have resulted in very long delays for cell saturation if not for the SBD clamps. However, now with better processes and improved lithography, the saturation capacitance of the cell can be equal to or less than the metal line capacitance of the array. With the advent of improved circuit designs and very low standby currents (typically $\leq 5$ $\mu$A) the SBD's are no longer required. What is being disclosed here is the removing of the clamp SBD from the array CTS cells.

In summary, removing the clamps SBD diodes from the CTS cells will enable future arrays to be:

| more dense | (w) 32.6 × 44.5 $\mu$m | (w/o) 32.6 × 41.0 $\mu$m |
|---|---|---|
| more stable | (w) 426 mv @ .1 pf | (w/o) 642 mv @ 2.0 pf |
| less power | (w) 5 $\mu$a @ .821 v | (w/o) 1 $\mu$a @ .609 v |

These comparisons were made using the same layout groundrules and photolithography restrictions that are representative of current technology. It can be appreciated that even more benefit can be achieved with future lithography improvements.

The unclamped CTS cell has a long writer time because of high stability. The use of a shunt to fix the word to drain line voltage is of great benefit to the stabilization of cell current and therefore saturation capacitance. It has been shown by computer simulation that it will improve the write time of the cell by a factor of eight.

The primary objects of the invention is to provide an improved random access read/write memory array.

A further primary object of the invention is to provide an improved random access read/write memory array employing unclamped CTS type memory cells of small area, high stability, low power requirements, high reliability (fewer components) and materially enhanced "write operation" time.

A still further object of the invention is to provide an improved random access read/write memory array employing unclamped CTS type memory cells and said array having materially improved "write operation" time and relatively high immunity to "alpha particle errors".

The concern over alpha particle sensitivity is fairly recent but a detailed explanation of bipolar RAM sensitivity to alpha particle bombardment can be found in the references set forth hereinafter. The modified CTS cell is at least an order of magnitude less sensitive to alpha particle errors than a comparable cell made with the same technology.

Reference

[1] "Cycle Time Dependence of Soft Errors due to α-rays for Bipolar RAMS," Y. Kato, et al., presented at the National Convention on Semiconductors and Materials (1981), sponsored by Institute of Electronic and Communication Engineers of Japan.

[2] "A 4.5ns Access Time 1K 4B ECL RAM, " J. NoKubo, et al., Digest of ISSCC 1983, p. 112.

[3] "A 15ns 16 KB ECL RAM with a PNP Load Cell," K. Toyoda, et al., Digest of ISSCC 1983.

[4] "Modelling of Single Event Upset in Bipolar Integrated Circuits," John A. Zoutendyk, ILEEE Transaction on Nucler Science, Vol. NS-30, No. 6, Dec. 1983.

[5] "Soft Error Rates in Static Bipolar RAMS," G. Sai-Halasz and D. D. Tang, IEDM 1983, p. 344.

[6] C. H. Hsieh, P. C. Murley and R. R. O'Brien 19th Annual Proc., Reliablity Physics Conf. (Orlando, FL), 1981, p 38.

[7] "Monte Carlo Modeling of the Transport of Ionizing Radiation Created Carriers in Integrated Circuits." G. A. Sai-Halasz and M. R. Wordemann, IEEE Electron Device Lett. Vol. 1, p. 211 (1980).

BRIEF DESCRIPTION OF THE DRAWING

The foregoing and other objects, features and advantages of the invention will be more apparent from the following more particular description of the preferred embodiment of the invention, as illustrated in the accompanying drawings.

PREFERRED EMBODIMENT

Figure 1:
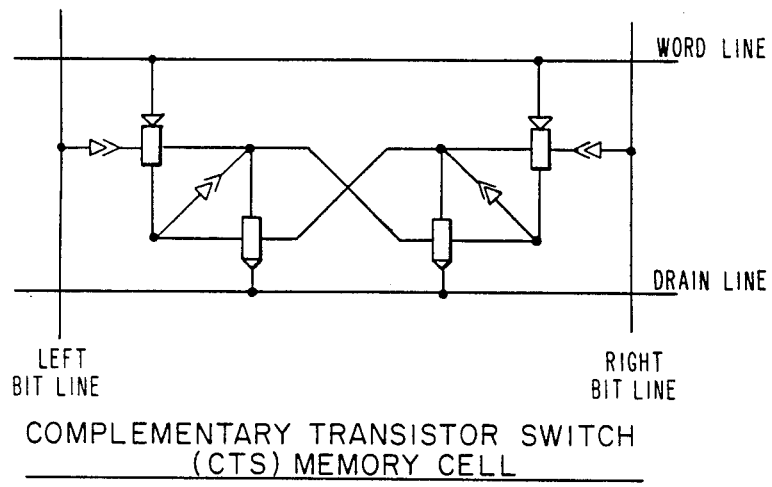
FIG. 1 is a circuit diagram of the well known (prior art) complementary transistor switch (CTS) memory cell.
Figure 2:
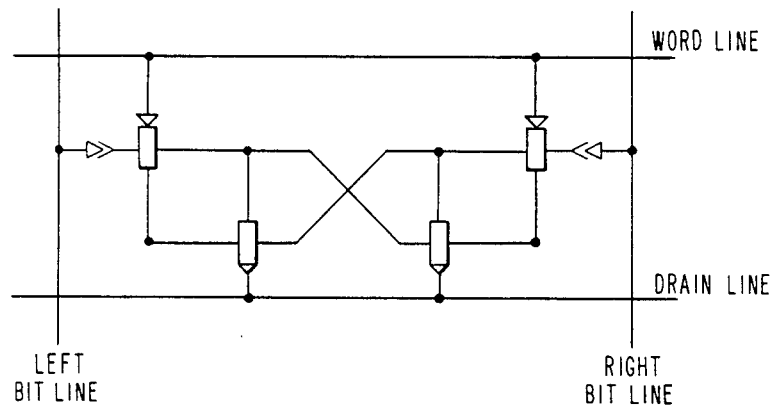
FIG. 2 is a circuit diagram of an unclamped complementary transistor switch (CTS) type memory cell which is employed in the preferred embodiment of the improved random access memory in accordance with the invention.
Figure 3A:
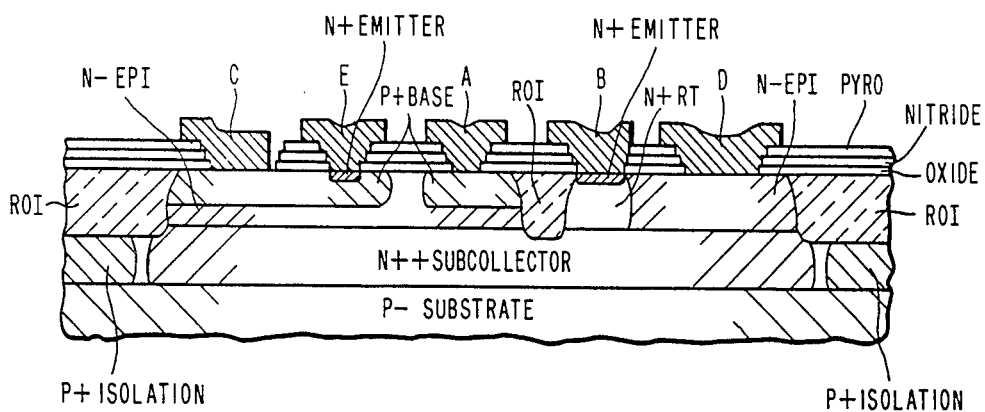
FIGS. 3A and 3B depict a structural layout of a half portion of the unclamped complementary transistor switch (CTS) memory cell of FIG. 2.
Figure 3B:
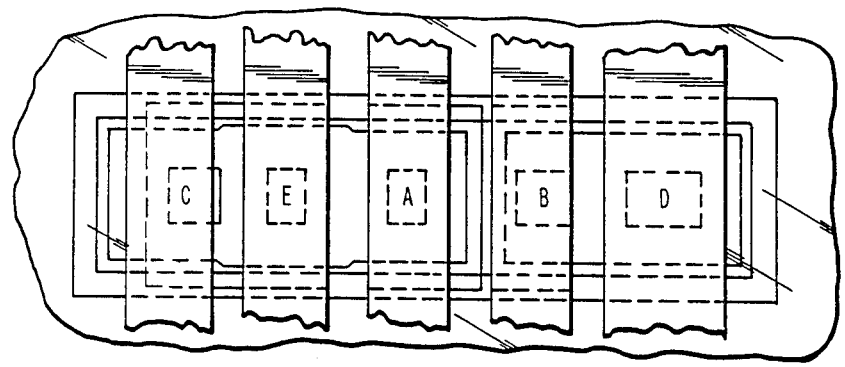
Figure 4:
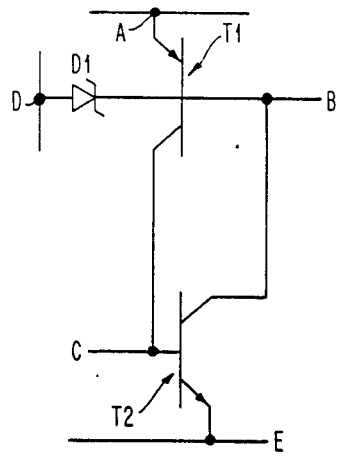
FIG. 4 is a circuit diagram corresponding to the structural layout of the half portion of the unclamped complementary transistor switch (CTS) memory cell of FIGS. 3A and 3B.
Figure 5B:
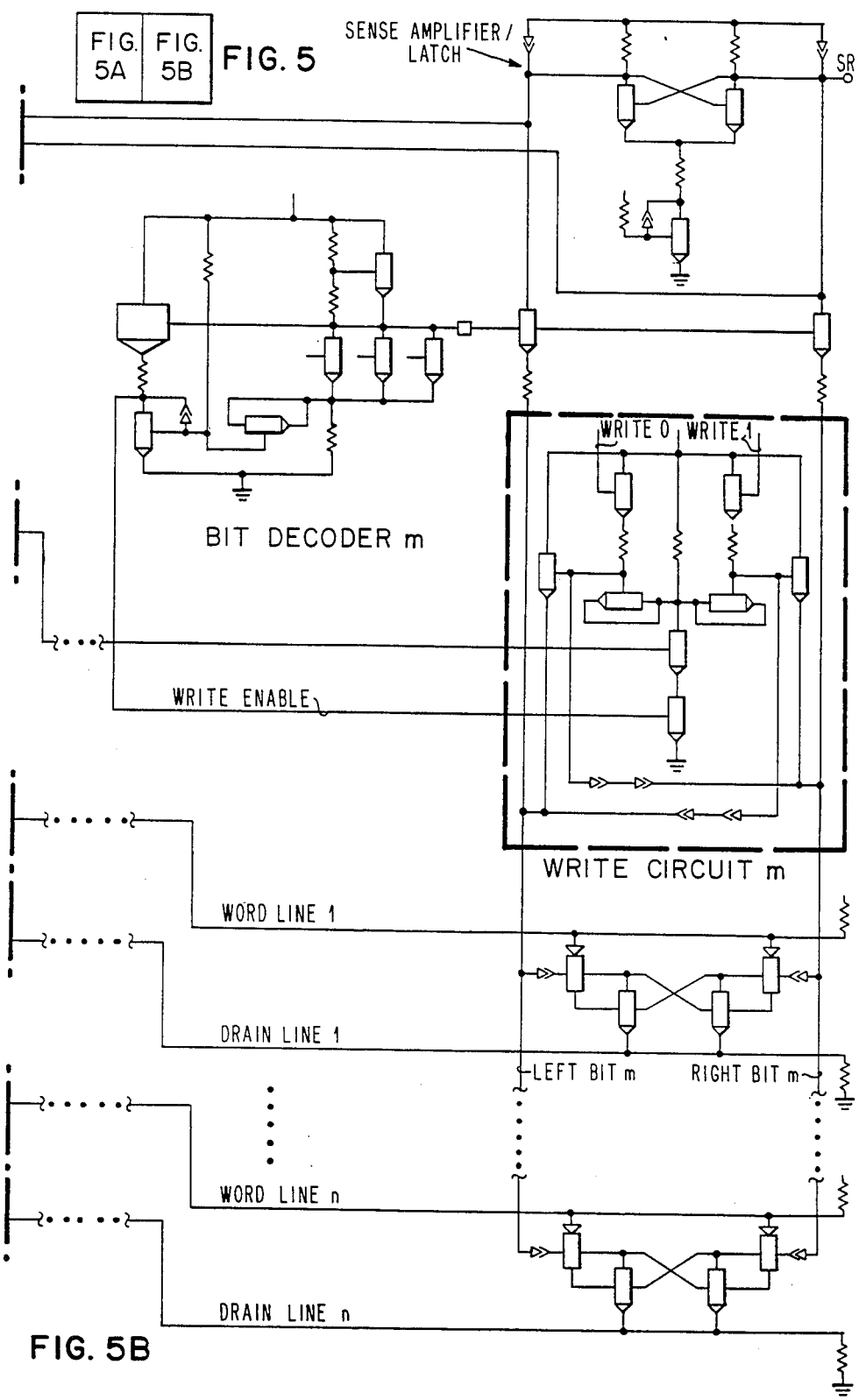
FIG. 5, a composite of FIGS. 5A and 5B, is a block diagram of a random access read/write memory array in accordance with the invention.
FIG. 5C discloses idealized waveforms illustrating the "read operation" and the "write operation" of the random access memory array in accordance with the invention and are to be viewed in conjunction with FIG. 5.
Figure 5A:
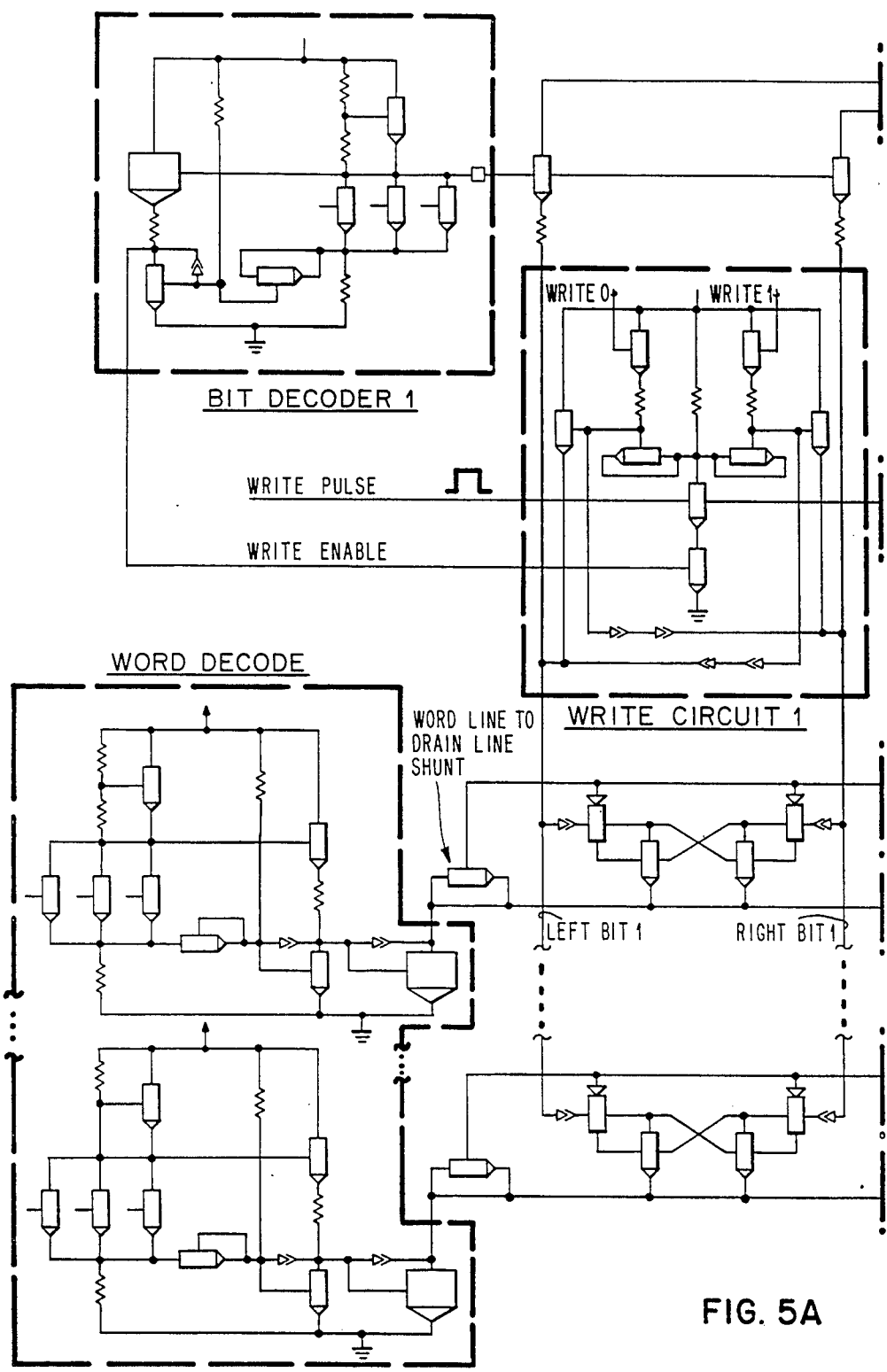
Figure 5C:
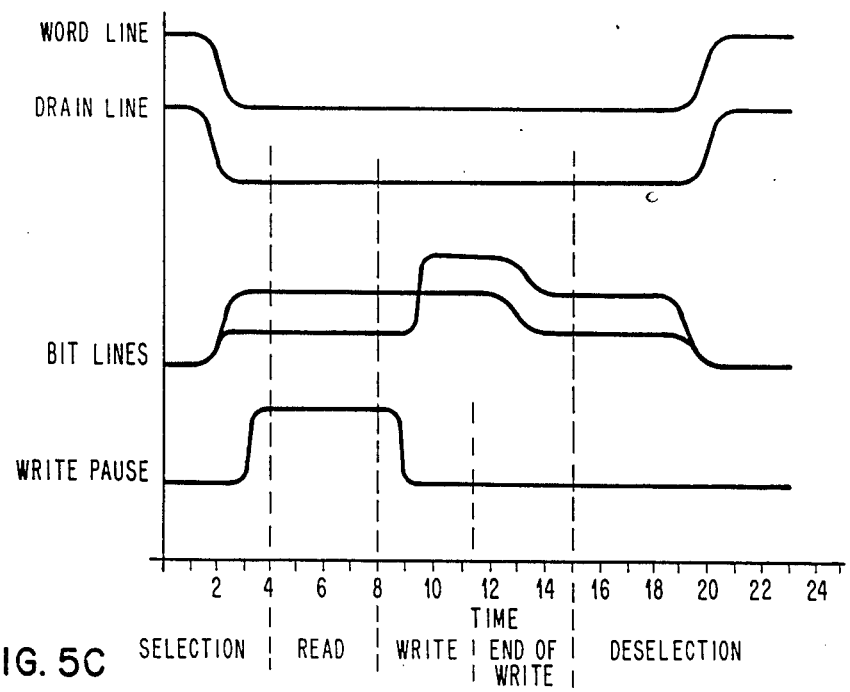
Figure 8:
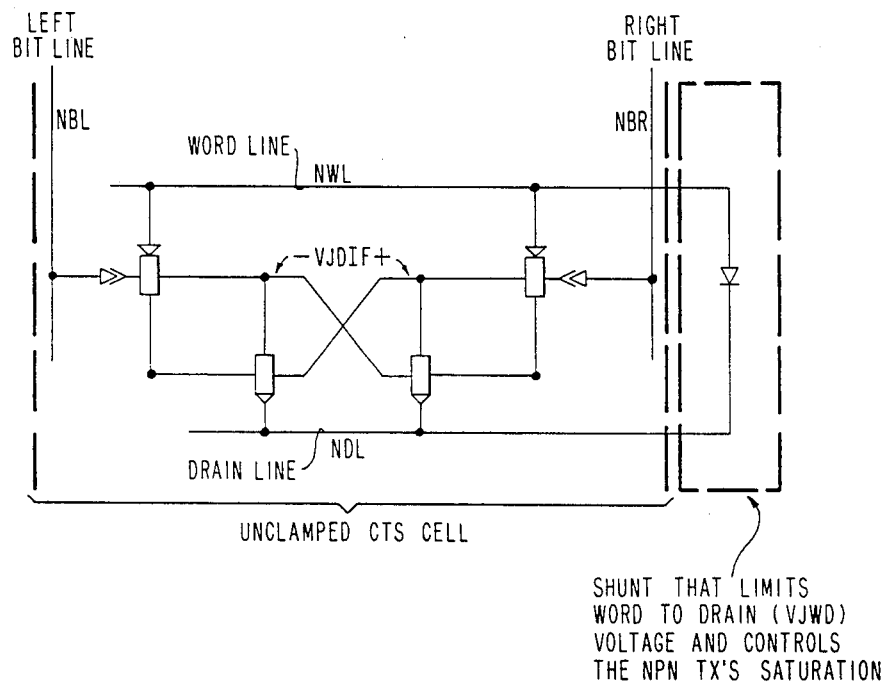
FIG. 8 depicts a circuit diagram of an unclamped CTS memory cell with a word line to drain line shunt.
Figure 6:
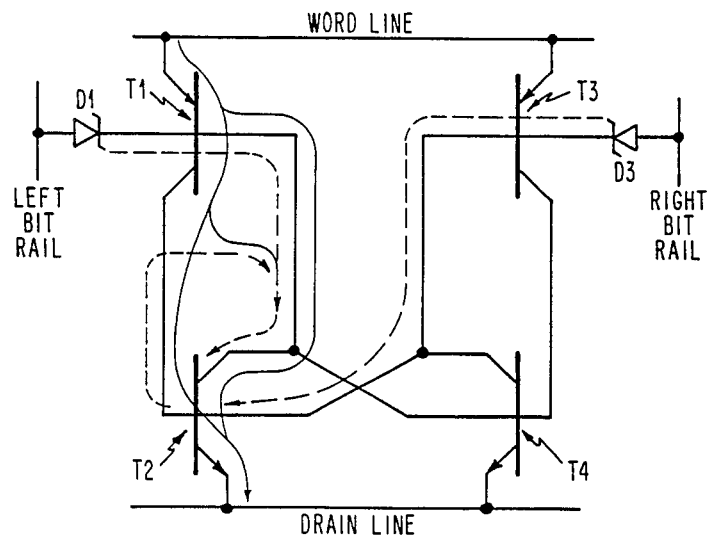
FIG. 6 depicts the circuitry and current paths of the unclamped complementary transistor switch (CTS) memory cell in a standby mode (solid lines for current flow) and in a "read mode", or "read operation" (dashed lines for current flow).
Figure 7:
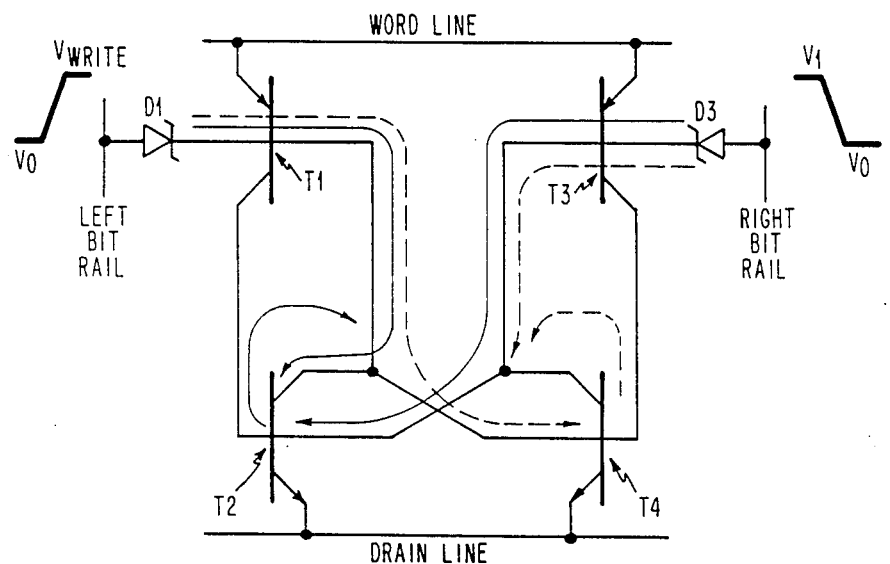
FIG. 7 depicts the circuitry and current paths of the unclamped complementary transistor switch (CTS) memory cell in a "write mode" or "write operation" (solid lines represent current flow for present state, dashed lines represent current flow for next state).
Figure 9:
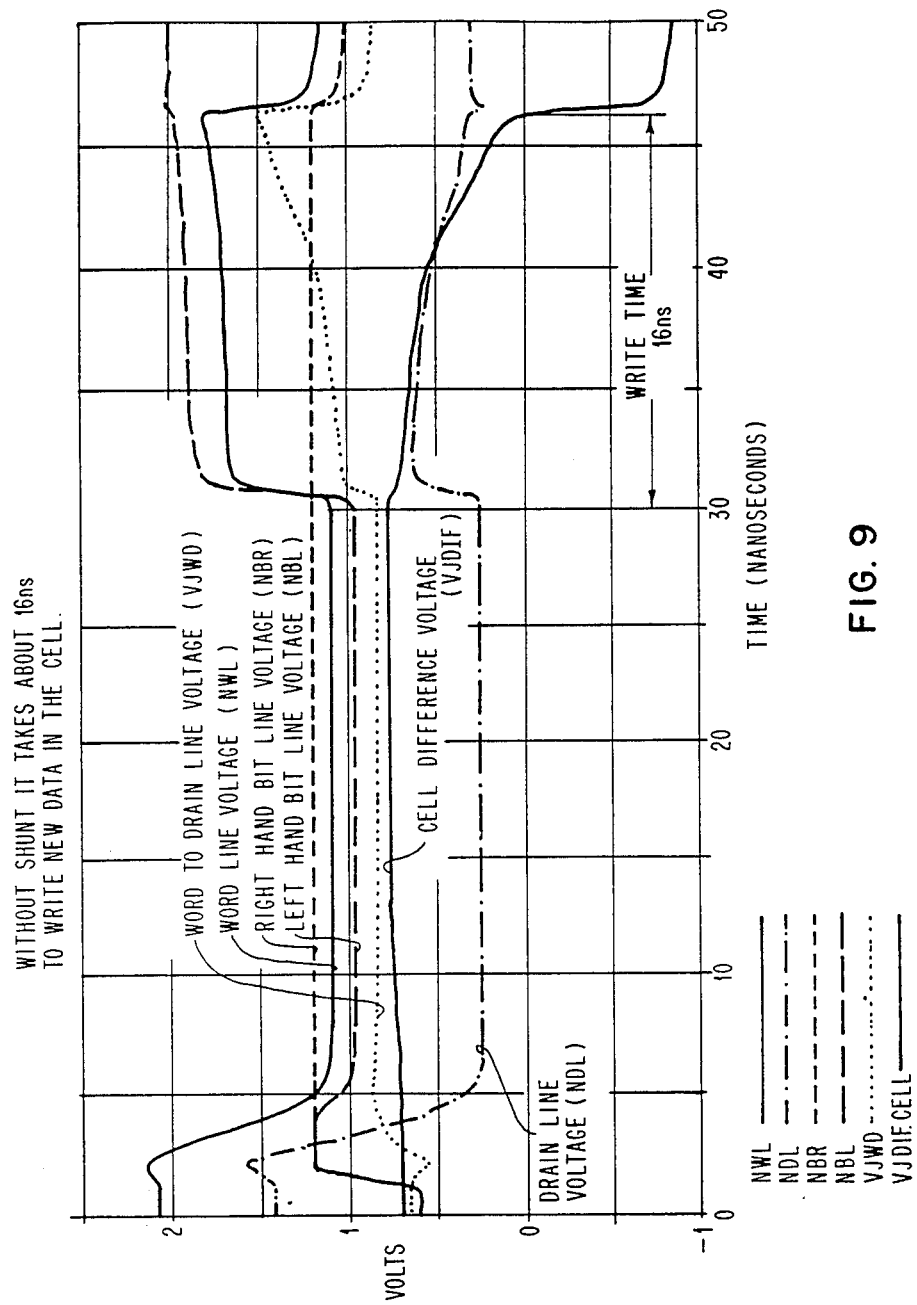
FIG. 9 discloses idealized waveforms to be viewed in conjunction with the hereinafter explanation of the "write operation" of an unclamped CTS memory cell in the absence of a word line to drain line shunt.
Figure 10:
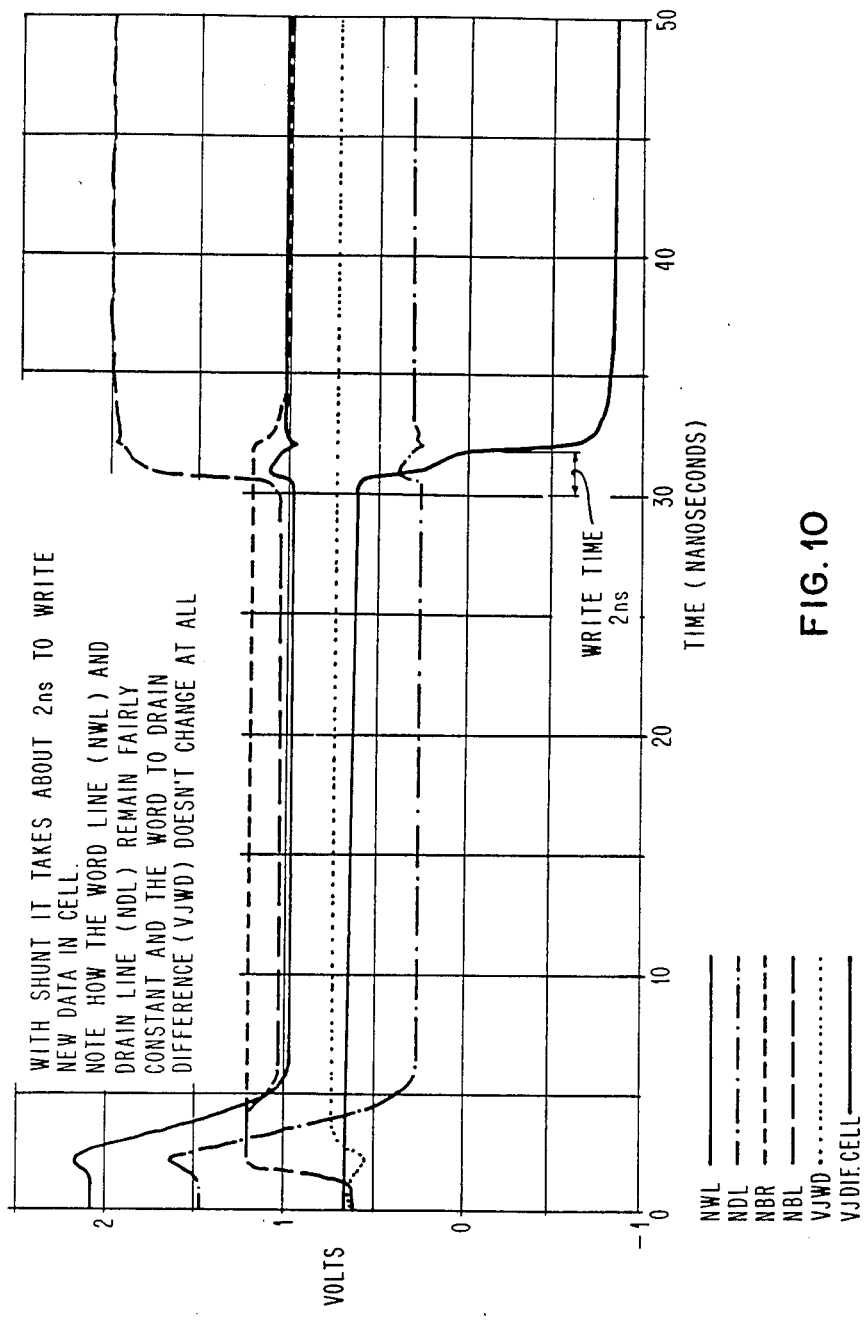
FIG. 10 discloses idealized waveforms to be viewed in conjunction with the hereinafter explanation of the "write operation" of an unclamped CTS memory cell in the presence of a word line to drain line shunt.

Refer to FIG. 5 for the preferred embodiment of the invention. In an array of memory cells comprised of M columns and N rows, a cell is selected by simultaneously raising the voltage on the pair of bit lines and lowering the voltage on the word and drain lines it is connected to. The method of lowering the voltage on the word and drain lines has almost exclusively been used to cause a higher current to flow through the memory cell and reinforce the state it is in. This method allows a faster read operation because the increased current flow is easier to sense. However in the case of the unclamped CTS cell, an increase in cell current is highly detrimental to the ability to change the cells state when writing it.

The current thru the unclamped CTS cell is exponentially related to the voltage from word line to drain line. The use of a word to drain line shunt, in this case is a diode connected transistor (FIG. 5A), or a simple PN diode, to fix the word to drain line difference is a tremendous aid in stabilizing the cell current even though the word and drain line voltage changes substantially during selection. The diode shunt fixes the word to drain line voltage by maintaining the differential to a level equal to a diode $V_f$ rather than the PNP-NPN combination of the unclamped CTS memory cell. The PN diode and the diode connected transistor are equivalent devices as employed herein.

Although the invention has been described with a certain degree of particularity, it is understood that the present disclosure has been made only by way of example and that numerous changes may be made without departing from the spirit and scope of the invention.

What is claimed is:

1. In a solid state randon access memory, said solid state memory including:
   at least first and second pairs of bit lines, each pair of bit lines including a left bit line an a right bit line;
   at least first and second pairs of word-drain lines, each pair of word-drain lines including a word line and a drain line;
   at least first, second, third and fourth unclamped complementary transistor switch (CTS) memory cells, each of said first, second, third and fourth unclamped complementary transistor switch memory cells including cross-coupled first and second NPN transistors and first and second PNP load transistors,
   said first and second unclamped CTS memory cells each being connected between said word line and said drain line of said first pair of word-drain lines and respectively between said first and second pairs of bit lines,
   said third and fourth unclamped CTS memory cells each being connected between said word line and said drain line of said second pair of word-drain lines and respectively between said first and second pairs of bit lines; and
   said solid state random access memory being characterized by the inclusion of first and second shunt circuit means, said first and second shunt circuit means respectively connected across said word line and drain line of said first word-drain line pair and said word line and drain line of said second word-drain line pair, said first and second shunt circuit means respectively limiting word line to drain line voltage and also controlling the saturation of said NPN transistors employed in said unclamped CTS memory cells, said solid state random access memory being further characterized in that said first and second shunt circuit means are respectively PN diodes or diode connected transistors.

2. In a solid state random access memory, as recited in claim 1, wherein each of said complementary transistor switch (CTS) memory cells comprise:
   first and second PNP transistors, said first and second PNP transistors each having an emitter, base and collector, said emitters of said first and second PNP transistors being respectively connected to a predetermined one of said word lines;
   first and second NPN transistors, said first and second NPN transistors each having an emitter, base and collector, said base of said first NPN transistor being connected in common to said collector of said first PNP transistor, said collector of said second NPN transistor and said base of said second PNP transistor, said base of said second NPN transistor being connected in common to said collector of said second PNP transistors, said collector of said first NPN transistor and said base of said first PNP transistor, said emitters of said first and second NPN transistors being respectively connected to a predetermined one of said drain lines;
   a first Schottky diode connected between said base of said first PNP transistor and a predetermined one of said left bit lines; and
   a second Schottky diode connected between said base of said second PNP transistor and a predetermined one of said right bit lines.

* * * * *